(12) United States Patent
Jackl

(10) Patent No.: US 11,744,015 B2
(45) Date of Patent: Aug. 29, 2023

(54) INTERPOSER AND METHOD FOR PRODUCING HOLES IN AN INTERPOSER

(71) Applicant: Schott AG, Mainz (DE)

(72) Inventor: Oliver Jackl, Alfeld (DE)

(73) Assignee: SCHOTT AG, Mainz (DE)

( * ) Notice: Subject to any disclaimer, the term of this patent is extended or adjusted under 35 U.S.C. 154(b) by 337 days.

(21) Appl. No.: 16/600,191

(22) Filed: Oct. 11, 2019

(65) Prior Publication Data

US 2020/0045817 A1 Feb. 6, 2020

Related U.S. Application Data

(62) Division of application No. 13/807,386, filed as application No. PCT/EP2011/003300 on Jul. 4, 2011, now abandoned.

(30) Foreign Application Priority Data

Jul. 2, 2010 (DE) ............... 10 2010 025 966.7

(51) Int. Cl.
*H05K 1/11* (2006.01)
*H05K 3/00* (2006.01)
(Continued)

(52) U.S. Cl.
CPC .......... *H05K 1/115* (2013.01); *B23K 26/0093* (2013.01); *B23K 26/0622* (2015.10); *B23K 26/126* (2013.01); *B23K 26/14* (2013.01); *B23K 26/38* (2013.01); *B23K 26/382* (2015.10); *B23K 26/384* (2015.10); *B23K 26/40* (2013.01); *H01L 21/486* (2013.01); *H01L 23/15* (2013.01); *H01L 23/49827* (2013.01); *H05K 1/0306* (2013.01); *H05K 3/0029* (2013.01); *B23K 2101/40* (2018.08); *B23K 2103/42* (2018.08);
(Continued)

(58) Field of Classification Search
CPC .. H05K 1/115; B23K 26/0093; H01L 21/486; H01L 23/15; H01L 23/49827
See application file for complete search history.

(56) References Cited

U.S. PATENT DOCUMENTS 3,483,373 A 12/1969 Asmus
3,562,009 A 2/1971 Cranston
(Continued)

FOREIGN PATENT DOCUMENTS

CN 1161899 10/1997
CN 1207340 2/1999
(Continued)

*Primary Examiner* — Bac H Au
(74) *Attorney, Agent, or Firm* — Ruggiero McAllister & McMahon LLC

(57) ABSTRACT

An interposer for electrical connection between a CPU chip and a circuit board is provided. The interposer includes a board-shaped base substrate made of glass having a coefficient of thermal expansion ranging from $3.1\times10^{-6}$/K to $3.4\times10^{-6}$/K. The interposer further includes a number of holes having diameters ranging from 20 μm to 200 μm. The number of holes ranging from 10 to 10,000 per square centimeter. Conductive paths running on one surface of the board extend right into respective holes and therethrough to the other surface of the board in order to form connection points for the chip.

17 Claims, 2 Drawing Sheets

(51) Int. Cl.
*B23K 26/00* (2014.01)
*H01L 23/15* (2006.01)
*B23K 26/14* (2014.01)
*H01L 23/498* (2006.01)
*H05K 1/03* (2006.01)
*B23K 26/12* (2014.01)
*H01L 21/48* (2006.01)
*B23K 26/384* (2014.01)
*B23K 26/382* (2014.01)
*B23K 26/0622* (2014.01)
*B23K 26/40* (2014.01)
*B23K 26/38* (2014.01)
*B23K 103/00* (2006.01)
*B23K 101/40* (2006.01)

(52) U.S. Cl.
CPC .. *B23K 2103/50* (2018.08); *H01L 2924/0002* (2013.01); *H05K 3/0017* (2013.01); *H05K 2201/10378* (2013.01); *H05K 2203/087* (2013.01)

(56) References Cited

U.S. PATENT DOCUMENTS

| | | | |
|---|---|---|---|
| 3,783,237 A | 1/1974 | McArthur | |
| 4,247,754 A | 1/1981 | Baier | |
| 4,278,871 A | 7/1981 | Schmidt-Kufeke | |
| 4,390,774 A | 6/1983 | Steen | |
| 4,662,969 A | 5/1987 | Wang | |
| 4,777,338 A | 10/1988 | Cross | |
| 4,923,608 A | 5/1990 | Flottmann | |
| 5,367,143 A | 11/1994 | White, Jr. | |
| 5,770,889 A | 6/1998 | Rostoker | |
| 6,114,240 A * | 9/2000 | Akram | H01L 25/105 257/E21.597 |
| 6,348,675 B1 | 2/2002 | Takagi | |
| 6,399,892 B1 | 6/2002 | Milkovich | |
| 6,400,172 B1 | 6/2002 | Akram | |
| 6,888,096 B1 | 5/2005 | Hamada | |
| 6,952,049 B1 | 10/2005 | Ogawa | |
| 7,109,068 B2 | 9/2006 | Akram | |
| 7,205,635 B1 * | 4/2007 | MacIntyre | H01L 24/12 257/E23.021 |
| 7,545,044 B2 | 6/2009 | Shibayama | |
| 7,738,258 B2 | 6/2010 | Ohno | |
| 7,763,965 B2 | 7/2010 | Webb | |
| 8,039,957 B2 | 10/2011 | Heinrich | |
| 8,136,820 B2 | 3/2012 | Morioka | |
| 8,440,916 B2 | 5/2013 | Li | |
| 8,624,374 B2 | 1/2014 | Ding | |
| 8,674,513 B2 | 3/2014 | Yu | |
| 9,018,565 B2 * | 4/2015 | Nattermann | B81C 1/00087 219/384 |
| 2001/0040272 A1 * | 11/2001 | Mashino | H01L 21/486 257/532 |
| 2002/0180015 A1 | 12/2002 | Yamaguchi | |
| 2003/0047801 A1 | 3/2003 | Azuma | |
| 2003/0080408 A1 * | 5/2003 | Farnworth | H01L 21/76898 257/E21.597 |
| 2004/0178492 A1 * | 9/2004 | Tsukamoto | H01L 23/49822 257/690 |
| 2004/0184219 A1 | 9/2004 | Otsuka | |
| 2005/0026476 A1 | 2/2005 | Mok | |
| 2005/0056913 A1 * | 3/2005 | Farnworth | H01L 21/486 438/362 |
| 2006/0046468 A1 * | 3/2006 | Akram | H01L 21/76898 257/E21.597 |
| 2006/0094584 A1 | 5/2006 | Shojiya | |
| 2006/0202322 A1 | 9/2006 | Kariya | |
| 2007/0158832 A1 * | 7/2007 | Takaike | H01L 24/29 257/734 |
| 2008/0047935 A1 | 2/2008 | Schmidt | |
| 2008/0049374 A1 | 2/2008 | Morioka et al. | |
| 2008/0054486 A1 | 3/2008 | Murayama | |
| 2008/0073110 A1 | 3/2008 | Shioga | |
| 2009/0033337 A1 | 2/2009 | Pasco | |
| 2009/0115050 A1 * | 5/2009 | Kasuya | H01L 23/3677 257/701 |
| 2009/0145636 A1 | 6/2009 | Miki | |
| 2009/0239331 A1 | 9/2009 | Xu | |
| 2010/0244276 A1 | 9/2010 | Burleson | |
| 2010/0264552 A1 * | 10/2010 | Nakasato | H01L 24/16 174/266 |
| 2010/0288550 A1 * | 11/2010 | Nagamatsu | H01L 23/49827 174/262 |
| 2010/0308474 A1 | 12/2010 | Shibuya | |
| 2011/0256344 A1 | 10/2011 | Ono | |
| 2013/0209731 A1 | 8/2013 | Nattermann | |
| 2013/0213467 A1 | 8/2013 | Nattermann | |
| 2013/0330506 A1 * | 12/2013 | Schmidt | B23K 26/50 428/131 |
| 2014/0042146 A1 | 2/2014 | Muller-Siebert | |

FOREIGN PATENT DOCUMENTS

| | | |
|---|---|---|
| CN | 101131955 | 2/2008 |
| CN | 201257685 | 6/2009 |
| DE | 2830326 | 1/1980 |
| DE | 3742770 | 6/1989 |
| EP | 2392549 | 12/2011 |
| FR | 2475064 | 8/1981 |
| FR | 2677271 | 12/1992 |
| JP | 55515198 | 2/1980 |
| JP | S61173899 | 8/1986 |
| JP | H0740150 | 2/1995 |
| JP | H07241731 | 9/1995 |
| JP | H07241732 | 9/1995 |
| JP | H07266142 | 10/1995 |
| JP | H09255351 | 9/1997 |
| JP | H11197947 | 7/1999 |
| JP | 2002028799 | 1/2002 |
| JP | 2003086739 | 3/2003 |
| JP | 2003249606 | 9/2003 |
| JP | 2003311459 | 11/2003 |
| JP | 2004288839 | 10/2004 |
| JP | 2004306137 | 11/2004 |
| JP | 2008066481 | 3/2008 |
| JP | 2008512858 | 4/2008 |
| KR | 100477146 | 3/2005 |
| WO | 97/03460 | 1/1997 |
| WO | 2006029250 | 3/2006 |
| WO | 2008105535 | 9/2008 |
| WO | 2009059786 | 5/2009 |
| WO | 2009074338 | 6/2009 |
| WO | 2009110288 | 9/2009 |
| WO | 2010087483 | 8/2010 |

* cited by examiner

INTERPOSER AND METHOD FOR PRODUCING HOLES IN AN INTERPOSER

CROSS REFERENCE TO RELATED APPLICATIONS

This application is a continuation of application Ser. No. 13/807,386 filed Apr. 8, 2013, which is US National Stage application under 35 USC § 371 of PCT/EP2011/003300 filed Jul. 4, 2011, which claims benefit under 35 USC § 119(a) of German Application No. 10 2010 025 966.7 filed Jul. 2, 2010, the entire contents of all of which are incorporated herein by reference.

BACKGROUND

1. Field of the Invention

The invention relates to interposers for electrically connecting the terminals of a CPU chip and a circuit board, and further relates to methods used in a critical manufacturing step of interposers.

2. Description of Related Art

A CPU chip, as a processor core, typically has several hundred contact points on its bottom surface, which are closely spaced to one another and distributed over a relatively small area. Due to this close spacing, these contact points cannot be mounted directly to a circuit board, the so called motherboard. Therefore, an intermediate part is employed which permits to enlarge the connection base. As an intermediate part, often, a glass fiber mat encased in epoxy material is employed, which is provided with a number of holes. Conductive paths running on one surface of the glass fiber mat extend into respective holes to fill them and to lead to the terminals of the processor core at the other surface of the glass fiber mat. For this purpose, an underfill is applied both around the processor core and between the processor core and the glass fiber mat, which protects the wires and mechanically joins the processor core and the glass fiber mat. However, the processor core and the glass fiber mat exhibit different thermal expansions. For example, the glass fiber mat has an expansion coefficient from 15 to $17 \times 10^{-6}/K$, while the silicon-based core processor has a thermal expansion factor from 3.2 to $3.3 \times 10^{-6}/K$. Therefore, in case of heating there are differential expansions between the core processor and the glass fiber mat and hence mechanical stresses arise between these two components. This can be detrimental to the contact connections, especially when the two components are not completely joined face to face. In this case the contact points may break easily.

Another drawback of using a glass fiber mat is related to the mechanical drilling of holes into the glass fiber mat. The hole diameter is limited to 250 to 450 μm.

Another possibility of designing and manufacturing connecting structures which could be used as a type of interposer is described in WO 02/058135 A2. Wafer technology is employed, including the generation of holes and trenches in dielectric material, such as silicon dioxide, and filling of the holes and trenches with conductive layers. However, this method of producing contact connections is very expensive.

A similar technology is taught in DE 103 01 291 B3. Recesses are etched into substrates and filled with metal conductive paths, and contacts extending through holes are also provided. This technique is complex and expensive.

U.S. 2002/0180015 A1 discloses a multi-chip module which includes semiconductor devices and a wiring substrate for mounting the semiconductor devices. The wiring substrate comprises a glass substrate having holes which were formed by a sand blasting treatment. A wiring layer is formed on the surface of the glass substrate. Furthermore, the glass substrate has wirings and an insulation layer. It is aimed at selecting the coefficient of thermal expansion of the glass substrate close to the coefficient of silicon.

U.S. Pat. No. 5,216,207 discloses ceramic multilayer circuit boards including silver conductors. The layers are fired at low temperatures. The circuit boards have a coefficient of thermal expansion close to that of silicon.

U.S. 2009/0321114 A1 discloses an electrical testing substrate unit including a multilayer ceramic substrate. Although the materials used have a coefficient of thermal expansion close to the value of the invention, they are not pure glasses.

U.S. Pat. No. 7,550,321 B1 discloses a substrate having a coefficient of thermal expansion with a gradient in the thickness direction.

The paper "Femtosecond laser-assisted three-dimensional microfabrication in silica" in Optics Letters, Vol. 26, No. 5, Mar. 1, 2001, pages 277-279 describes direct three-dimensional microfabrication in a silicate glass. The fabrication process is accomplished in two steps. First, the intended patterns are mapped out in the glass using focused femtosecond laser pulses. Then these patterns are etched.

SUMMARY

An object of the invention is to provide an interposer for electrical connection between a CPU chip and a circuit board, which is economical to produce and enables to produce microholes with a hole diameter in the order of 20 μm and 200 μm, and wherein the interposer body exhibits a thermal expansion similar to that of the CPU chip material.

The novel interposer should be able to meet the following requirements: Multiple small holes (10 to 10,000) are to be accommodated in each interposer, with close tolerances of the holes to each other. It has to be possible to ensure a hole spacing down to 30 μm. Hole diameters down to a size of 20 μm should be possible. A ratio of the thickness of the interposer to the hole diameter, the so-called aspect ratio, from 1 to 10 should be possible. A center-to-center distance of the holes in a range from 120 μm and 400 μm should be possible. The hole should have a conical or crater-shaped inlet and outlet to the hole, but the inner walls of the hole in the center should be of cylindrical shape. The hole should have smooth walls (fire-polished). Optionally, a bead may be produced around the edge of the hole, having a height of not more than 5 mm.

The interposer according to the invention is characterized in that its board-shaped base substrate is made of glass having a coefficient of thermal expansion ranging from $3.1 \times 10^{-6}/K$ to $3.4 \times 10^{-6}/K$. Silicon-based chip boards exhibit an expansion coefficient between $3.2 \times 10^{-6}/K$ and $3.3 \times 10^{-6}/K$. Therefore, large mechanical stresses between the interposer and the CPU chip due to different thermal expansion behavior are not to be expected.

The number of holes in the interposer is selected according to the particular requirements and may amount up to 10,000 holes per $cm^2$. A usual number of holes ranges from 1000 to 3000. The center-to-center spacing of the holes ranges from 50 μm to 700 μm. To meet the requirements of miniaturization of components, holes are provided which have a diameter ranging from 20 μm to 200 μm. To establish an electrical connection between the CPU chip and its circuit board, conductive paths extend on one of the surfaces of the interposer board to and into the holes and therethrough to form connection points for the CPU chip.

The glass of the base substrate should have an alkali content of less than 700 ppm. Such a glass has a low coefficient of thermal expansion, as required, and exhibits very good signal-insulating properties, due to the high dielectric value. Furthermore, the risk of contamination of silicon processors with alkalis is largely avoided.

For reasons of environmental protection, an arsenic or antimony content of the glass composition is less than 50 ppm.

Interposer boards have a thickness of less than 1 mm, but not below 30 μm. The number of holes of an interposer is chosen according to the needs, and is in the order from 1000 to 3000 holes per cm². The invention targets to offer interposers on the market having microholes smaller than 100 μm. Hence, the holes are closely packed, with a center-to-center distance of the holes that may range from 150 μm to 400 μm. However, the edge-to-edge distance of the holes should not be less than 30 μm. The holes need not all have the same diameter, it is possible that holes of different diameters are provided in the board-shaped base substrate. The ratio of the thickness of the glass board to the hole diameter, the so-called aspect ratio, may be selected in a wide range from 0.1 to 25, an aspect ratio from 1 to 10 being preferred. The holes generally have a thin cylindrical shape, but may have rounded-broken edges at the inlet and outlet of the hole.

In order to accurately position the holes, which may have a diameter ranging from 20 μm to 200 μm, focused laser pulses are used in a wavelength range of transparency of the glass, so that the laser beams penetrate into the glass and are not already absorbed in the surface layers of the glass. The laser radiation used has a very high radiation intensity, so as to result in local non-thermal destruction of the glass along filamentary channels. These filamentary channels are subsequently widened to the desired diameter of the holes, for which purpose dielectric breakdowns may be employed which cause electro-thermal heating and evaporation of the material of the hole edges, and/or the filamentary channels are widened by supplying reactive gases.

It is also possible to precisely mark the intended perforation points using RF coupling material which is printed onto the base substrate in form of dots. Such marked points are heated by RF energy to lower the breakdown strength to electrical high voltage in the region of the intended holes, and to finally cause dielectric breakdowns at these points. The perforations may be widened by supplied etching gas.

The manufacturing of the conductive paths on the board-shaped glass substrate and through the holes is accomplished by known method patterns and need not be further described here.

BRIEF DESCRIPTION OF THE DRAWINGS

Exemplary embodiments of the invention will be described with reference to the drawings, wherein.

DETAILED DESCRIPTION

Figure 1:
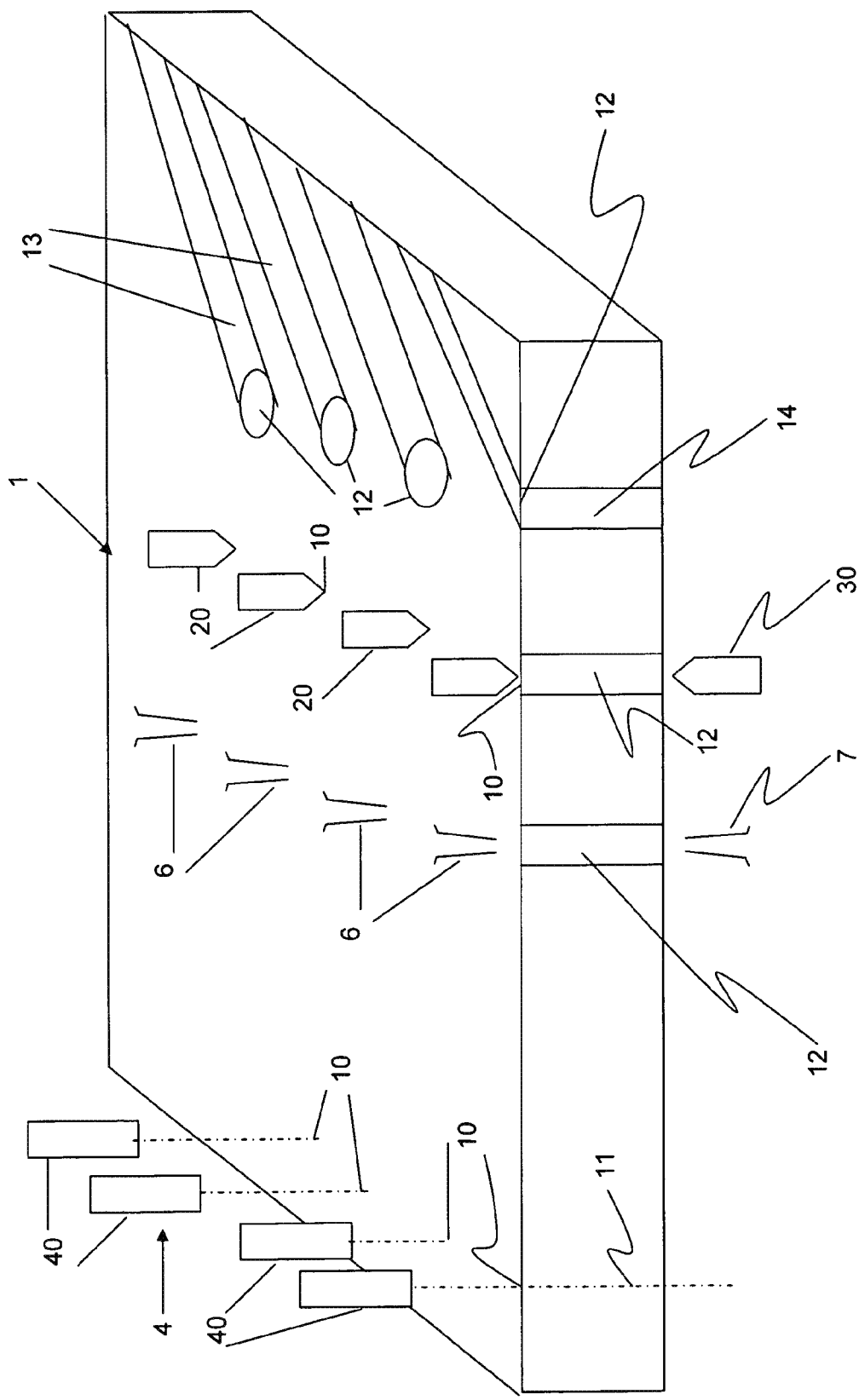
FIG. 1 schematically illustrates, in a longitudinal sectional view, one way of producing an interposer.

In a first method step, perforation points 10 on a board-shaped glass substrate 1 are marked by focused laser pulses 41 emanating from an array 4 of lasers 40. The radiation intensity of these lasers is so strong that it causes local non-thermal destruction in the glass along a filamentary channel 11.

In a second method step, filamentary channels 11 are widened into holes 12. For this purpose, opposing electrodes 6 and 7 may be employed, to which high voltage energy is applied, resulting in dielectric breakdowns across the glass substrate along filamentary channels 11. These breakthroughs are widened by electro-thermal heating and evaporation of the perforation material until the process is stopped by switching off the power supply when the desired hole diameter is achieved.

Alternatively or additionally, the filamentary channels 11 may be widened using reactive gases, as illustrated by nozzles 20, 30, which direct the gas to the perforation points 10.

In the next method step, conductive paths 13 to the perforation points 10 are applied on the upper surface of glass board 1, and the holes 12 are filled with conductive material 14 to complete the connections to the contact points of a CPU chip or the like at the bottom surface of the board. (For mounting on the motherboard, glass board 1 is turned around.)

Figure 2:
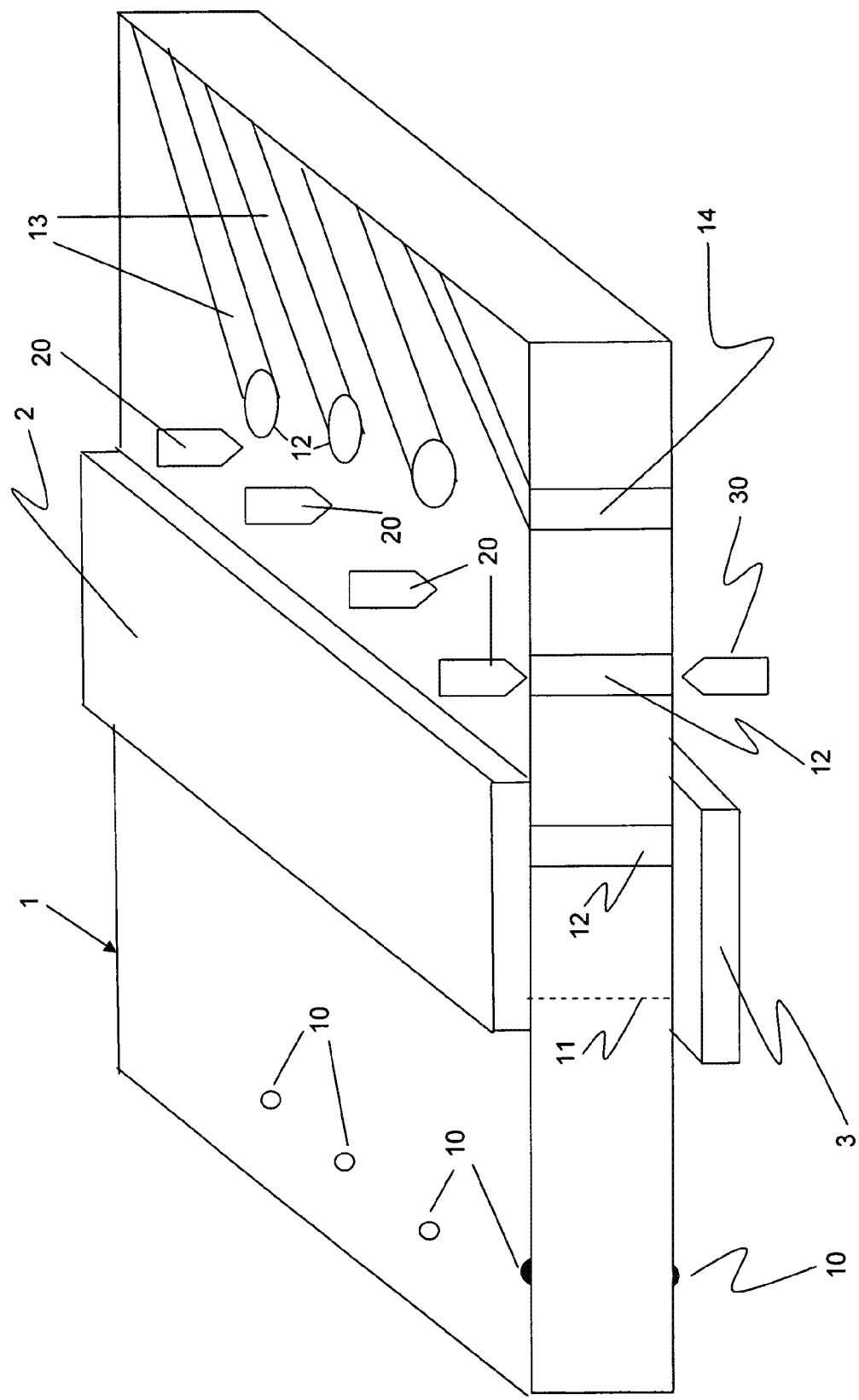
FIG. 2 illustrates a second way of producing an interposer.

FIG. 2 shows another way of producing microholes. Perforation points 10 are marked by precisely imprinted RF coupling material. At these points 10 high frequency energy is applied by means of electrodes 2, 3, so that the coupling points themselves and the glass material between the upper surface coupling points and the lower surface coupling points is heated, causing the dielectric strength of the material to be lowered. When a high voltage is applied, dielectric breakdowns will occur along narrow channels 11. By continuing the supply of high-voltage energy, these narrow channels 11 may be widened to the size of holes 12.

However, it is also possible, for widening the narrow channels 11 resulting from dielectric breakdowns, to use reactive gas which is supplied through nozzles 20, 30.

Finally, conductive paths 13 to the holes 12 are applied on the upper surface of the glass substrate, and the holes are filled with conductive material 14 in order to establish the connections for the CPU chip, with the glass board 1 turned around.

It should be noted that interposers need not to be produced separately, rather glass substrate boards for a plurality of interposers may be processed, and the large-sized glass substrate boards may be cut to obtain the individual interposers. Glass substrate boards of a size with edge lengths of 0.2 m by 3 m (or less) can be processed. Round board formats may have dimensions of up to 1 m.

Glasses were melted at 1620° C. in Pt/Ir crucibles from conventional, essentially alkali-free raw materials, apart from unavoidable impurities. The melt was refined for one and a half hour at this temperature, then poured into inductively heated platinum crucibles and stirred for 30 minutes at 1550° C. for homogenization.

The table shows fifteen examples of suitable glasses and their compositions (in wt. % based on oxide) and their main features. The refining agents $SnO_2$ (Examples 1-8, 11, 12, 14, 15) and $As_2O_3$ (Examples 9, 10, 13) with a proportion of 0.3 wt. % is not listed. The following properties are specified:

the coefficient of thermal expansion $\alpha_{20/300}$ ($10^{-6}$/K)
the density $\varrho$ (g/cm³)
the dilatometric glass transition temperature $T_g$ (° C.) according to DIN 52324 the temperature at a viscosity of $10^4$ dPa·s (referred to as T4 [° C.])

the temperature at a viscosity of $10^2$ dPa·s (referred to as T2 [° C.]), calculated from the Vogel-Fulcher-Tammann equation an "HCl" acid resistance as weight loss (material removal value) of glass boards measuring 50 mm×50 mm×2 mm and polished on all sides after treatment with 5% hydrochloric acid for 24 hours at 95° C. (mg/cm²).

a "BHF" resistance to buffered hydrofluoric acid as a weight loss (material removal value) of glass boards measuring 50 mm×50 mm×2 mm and polished on all sides after treatment with 10% NH$_4$F NH4F·HF for 20 min at 23° C. (mg/cm²)

the refractive index $n_d$.

EXAMPLES

Compositions (in wt. % based on oxide), and essential properties of glasses according to the invention As the exemplary embodiments illustrate, the glasses have the following advantageous properties:

a thermal expansion a 20/300 of between 2.8×10$^{-6}$/K and 3.8×10$^{-6}$/K, in preferred embodiments 3.6×10$^{-6}$/K, in particularly preferred embodiments <3.2×10$^{-6}$/K, and thus matched to the expansion behavior of both amorphous silicon and also increasingly polycrystalline silicon.

with $T_g$>700° C., a high glass transition temperature, i.e. a high temperature resistance. This is essential for a lowest possible production-related shrinkage ("compaction") and for use of the glasses as substrates for coatings of amorphous Si layers and subsequent annealing thereof.

with ϱ <2.600 g/cm³, a low density a temperature at a viscosity of $10^4$ dPa·s (working point $V_A$) of not more than 1350° C., and a

|  | 1 | 2 | 3 | 4 | 5 | 6 |
|---|---|---|---|---|---|---|
| SiO$_2$ | 60.0 | 60.0 | 59.9 | 58.9 | 59.9 | 61.0 |
| B$_2$O$_3$ | 7.5 | 7.5 | 7.5 | 8.5 | 7.5 | 9.5 |
| Al$_2$O$_3$ | 21.5 | 21.5 | 21.5 | 21.5 | 21.5 | 18.4 |
| MgO | 2.9 | 2.9 | 2.0 | 2.0 | 2.9 | 2.2 |
| CaO | 3.8 | 2.8 | 3.8 | 3.8 | 4.8 | 4.1 |
| BaO | 4.0 | 5.0 | 5.0 | 5.0 | 3.1 | 4.5 |
| ZnO | — | — | — | — | — | — |
| α$_{20/300}$ (10$^{-6}$/K) | 3.07 | 3.00 | 3.01 | 3.08 | 3.13 | 3.11 |
| ϱ (g/cm³) | 2.48 | 2.48 | 2.48 | 2.48 | 2.47 | 2.45 |
| Tg (° C.) | 747 | 748 | 752 | 741 | 743 | 729 |
| T 4 (° C.) | 1312 | 1318 | 1315 | 1308 | 1292 | 1313 |
| T 2 (° C.) | 1672 | 1678 | 1691 | 1668 | 1662 | 1700 |
| n$_d$ | 1.520 | 1.518 | 1.519 | 1.519 | 1.521 | 1.515 |
| HCl (mg/cm²) | 1.05 | n.m. | 0.85 | n.m. | 1.1 | n.m. |
| BHF (mg/cm²) | 0.57 | 0.58 | 0.55 | 0.55 | 0.56 | 0.49 |

|  | 7 | 8 | 9 | 10 | 11 | 12 |
|---|---|---|---|---|---|---|
| SiO$_2$ | 58.5 | 62.8 | 63.5 | 63.5 | 59.7 | 59.0 |
| B$_2$O$_3$ | 7.7 | 8.2 | 10.0 | 10.0 | 10.0 | 9.0 |
| Al$_2$O$_3$ | 22.7 | 16.5 | 15.4 | 15.4 | 18.5 | 17.2 |
| MgO | 2.8 | 0.5 | 2.0 | 1.0 | | 2.0 |
| CaO | 2.0 | 4.2 | 5.6 | 6.6 | 8.3 | 9.0 |
| BaO | 5.0 | 7.5 | 3.2 | 3.2 | 3.2 | 3.5 |
| ZnO | 1.0 | — | — | — | — | — |
| α$_{20/300}$ (10$^{-6}$/K) | 2.89 | 3.19 | 3.24 | 3.34 | 3.44 | 3.76 |
| ϱ (g/cm³) | 2.50 | 2.49 | 2.42 | 2.43 | 2.46 | 2.50 |
| Tg (° C.) | 748 | 725 | 711 | 719 | 714 | 711 |
| T 4 (° C.) | 1314 | 1325 | 1320 | 1327 | 1281 | 1257 |
| T 2 (° C.) | 1674 | 1699 | n.m. | n.m. | 1650 | 1615 |
| n$_d$ | 1.520 | 1.513 | 1.511 | 1.512 | 1.520 | 1.526 |
| HCl (mg/cm²) | n.m. | 0.30 | 0.89 | n.m. | n.m. | 0.72 |
| BHF (mg/cm²) | 0.62 | 0.45 | 0.43 | 0.40 | 0.44 | 0.49 |

|  | 13 | 14 | 15 |
|---|---|---|---|
| SiO$_2$ | 61.4 | 59.5 | 63.9 |
| B$_2$O$_3$ | 8.2 | 10.0 | 10.4 |
| Al$_2$O$_3$ | 16.0 | 16.7 | 14.6 |
| MgO | 2.8 | 0.7 | 2.9 |
| CaO | 7.9 | 8.5 | 4.8 |
| BaO | 3.4 | 3.8 | 3.1 |
| ZnO | — | 0.5 | — |
| α$_{20/300}$ (10$^{-6}$/K) | 3.75 | 3.60 | 3.21 |
| ϱ (g/cm³) | 2.48 | 2.48 | 2.41 |
| Tg (° C.) | 709 | 702 | 701 |
| T 4 (° C.) | 1273 | 1260 | 1311 |
| T 2 (° C.) | 1629 | 1629 | n.m. |
| n$_d$ | 1.523 | 1.522 | n.m. |
| HCl (mg/cm²) | 0.41 | 0.97 | n.m. |
| BHF (mg/cm²) | 0.74 | 0.47 | n.m. | n.m. = not measured temperature at a viscosity of $10^2$ dPa·s of not more than 1720° C., which is a suitable viscosity characteristic in terms of hot-shaping and meltability.

with $n_d \leq 1.526$ a low refractive index.

a high chemical resistance, as is evident inter alia from good resistance to buffered hydrofluoric acid solution.

The glasses exhibit high thermal shock resistance and good devitrification stability. The glasses can be produced as flat glasses by various drawing methods, e.g. microsheet down-draw, up-draw, or overflow fusion methods, and, in a preferred embodiment, if they are free of $As_2O_3$ and $Sb_2O_3$, also by the float process.

With these properties, the glasses are highly suitable for use as substrate glass for producing interposers.

By using the base substrate of low-alkali glass and with a coefficient of thermal expansion very close to that of the chip of silicon material, difficulties resulting from different thermal expansions of the interposer and the CPU chip are largely avoided. If adjacent joint material layers or boards have an only slightly different heating behavior and a slightly different coefficient of thermal expansion, there will be fewer mechanical stresses between these joint layers or boards, and there will be no warpage or cracking between the layers or boards.

Interposers which are occupied more densely with holes as compared to previous interposers, take smaller substrate sizes, thereby still further reducing the amount of different expansions and contractions of the involved layers or boards and thus the risk of warpage and hence cracking between the involved layers or boards.

Finally, cost savings can also be expected because (with reduced interposer size and hole size) less glass material and less conductive material for filling the holes has to be used.

What is claimed is:

1. A method for producing holes in a board-shaped base substrate of an interposer which is adapted for electrical connection between a CPU chip and a circuit board, the method comprising the steps of:
    providing the board-shaped base substrate to be perforated, the board-shaped base substrate being made of glass and having a first board surface and a second board surface opposite the first board surface;
    aligning laser beams to predetermined perforation points of the board-shaped base substrate;
    triggering focused laser pulses in a wavelength range between 1600 and 200 nm in which the glass is at least partially transparent so that laser beams penetrate into the glass and are not absorbed in the surface layer of the glass and with a radiation intensity that causes local only non-thermal destruction of the glass along filamentary channels at the predetermined perforation points; and
    widening the filamentary channels from both the first and second board surfaces to a desired diameter of the holes so that the holes have a cylindrical shape, wherein the widening comprises etching.

2. The method of claim 1, wherein the widening step comprises electro-thermal heating and evaporation of perforation material in the filamentary channels due to dielectric breakdowns.

3. The method of claim 1, wherein the widening step comprises directing reactive gases onto the filamentary channels.

4. The method of claim 1, wherein the board-shaped base substrate is made of a single layer of glass having a first and a second substrate surface.

5. The method of claim 4, wherein the board-shaped base substrate has transversely to the first and second substrate surfaces a number of holes extending through the single layer thickness and forming inner hole walls that make edges to the first and second surfaces.

6. The method of claim 4, further comprising forming conductive paths on the first substrate surface and through the holes to the second substrate surface.

7. The method of claim 4, further comprising applying a layer of conductive paths on the first substrate surface.

8. The method of claim 1, wherein the board-shaped base substrate has a coefficient of thermal expansion ranging from $3.1 \times 10^{-6}$/K to $3.4 \times 10^{-6}$/K.

9. The method of claim 1, wherein the number of holes ranges from 10 to 10,000 $cm^{-2}$.

10. The method of claim 1, wherein the holes having diameters that range from 20 μm to 200 μm.

11. The method of claim 1, wherein the holes have a center-to-center distance between the holes in a range from 50 μm to 700 μm.

12. The method of claim 1, wherein the step of aligning the laser beams comprises aligning a multiple laser beam array.

13. The Method of claim 1, wherein widening the filamentary channels is performed so that the holes have at the first and second board surfaces, a conical or crater-shaped inlet and outlet to the hole, respectively, and wherein the holes have inner wall in the center with a cylindrical shape.

14. A method for producing holes in an interposer adapted for electrical connection between a CPU chip and a circuit board, comprising:
    providing a single-layered board-shaped base substrate made of glass having a first and a second board surface;
    aligning laser beams to predetermined perforation points of the base substrate;
    triggering focused laser pulses in a wavelength range between 1600 and 200 nm in which the glass is at least partially transparent so that laser beams penetrate into the glass and are not absorbed in the surface layer of the glass and with a radiation intensity that causes local non-thermal destruction of the glass along a filamentary channel at each of the predetermined perforation points;
    widening the filamentary channels to holes that extend transversely through the base substrate between the first and second board surfaces, the holes numbering from 10 to 10,000 per $cm^2$, having diameters from 20 μm to 200 μm, and having distances as measured from center to center from 50 μm to 700 μm,
    wherein the widening is performed from the first and the second board surface so that the holes have a cylindrical shape, wherein the widening comprises etching; and
    applying a layer of conductive paths on the first board surface, wherein the conductive paths on the first board surface extend into the holes and therethrough to the second board surface to form connection points for the CPU chip.

15. The method of claim 14, wherein the widening step comprises electro-thermal heating and evaporation of perforation material in the filamentary channels due to dielectric breakdowns.

16. The method of claim 14, wherein the widening step comprises directing reactive gases onto the filamentary channels.

17. The method of claim 14, wherein widening is performed so that the holes have at the first and second board surfaces, a conical or crater-shaped inlet and outlet to the hole, respectively, and wherein the holes have inner wall in the center with a cylindrical shape.

* * * * *